United States Patent
Nguyen et al.

(10) Patent No.: US 7,414,312 B2
(45) Date of Patent: Aug. 19, 2008

(54) MEMORY-MODULE BOARD LAYOUT FOR USE WITH MEMORY CHIPS OF DIFFERENT DATA WIDTHS

(75) Inventors: Henry H. D. Nguyen, Fountain Valley, CA (US); Mark Burlington, Aliso Viejo, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 569 days.

(21) Appl. No.: 10/908,718

(22) Filed: May 24, 2005

(65) Prior Publication Data

US 2006/0267172 A1      Nov. 30, 2006

(51) Int. Cl.
*H01L 23/34*     (2006.01)
*H05K 7/00*      (2006.01)
*G11C 5/06*      (2006.01)

(52) U.S. Cl. .............. 257/724; 257/786; 257/E23.141; 361/760; 361/784; 361/803; 365/63

(58) Field of Classification Search ........................ None
See application file for complete search history.

(56) References Cited

U.S. PATENT DOCUMENTS

| | | | | |
|---|---|---|---|---|
| 4,884,237 A | | 11/1989 | Mueller et al. ................. | 365/63 |
| 5,754,408 A | * | 5/1998 | Derouiche ................... | 361/773 |
| 6,038,132 A | * | 3/2000 | Tokunaga et al. ........... | 361/760 |
| 6,542,393 B1 | | 4/2003 | Chu et al. ..................... | 365/51 |
| 6,614,664 B2 | | 9/2003 | Lee .............................. | 361/784 |
| 6,751,113 B2 | | 6/2004 | Bhakta et al. ................. | 365/63 |
| 6,839,241 B2 | | 1/2005 | Benisek et al. ............... | 361/760 |
| 6,891,729 B2 | * | 5/2005 | Ko et al. ....................... | 361/736 |
| 7,224,595 B2 | * | 5/2007 | Dreps et al. ................... | 365/63 |
| 7,337,522 B2 | * | 3/2008 | Engle et al. ................. | 29/564.1 |
| 7,356,737 B2 | * | 4/2008 | Cowell et al. ................. | 714/42 |
| 2002/0133665 A1 | | 9/2002 | Mailloux et al. ............. | 711/105 |
| 2003/0067063 A1 | | 4/2003 | Muff et al. ................... | 257/678 |
| 2004/0186956 A1 | | 9/2004 | Perego et al ................. | 711/115 |
| 2004/0221106 A1 | | 11/2004 | Perego et al. ................ | 711/115 |
| 2004/0256638 A1 | | 12/2004 | Perego et al. ................ | 257/200 |
| 2005/0044302 A1 | | 2/2005 | Pauley et al. .................... | 711/1 |

FOREIGN PATENT DOCUMENTS

JP            07022727 A   *   1/1995

* cited by examiner

*Primary Examiner*—Alonzo Chambliss
(74) *Attorney, Agent, or Firm*—gPatent LLC; Stuart J. Auvinen

(57) ABSTRACT

A memory module substrate printed-circuit board (PCB) has multi-type footprints and an edge connector for mating with a memory module socket on a motherboard. Two or more kinds of dynamic-random-access memory (DRAM) chips with different data I/O widths can be soldered to solder pads around the multi-type footprints. When ×4 DRAM chips with 4 data I/O pins are soldered over the multi-type footprints, the memory module has a rank-select signal that drives chip-select inputs to all DRAM chips. When ×8 DRAM chips with 8 data I/O pins are soldered over the multi-type footprints, the memory module has two rank-select signals. One rank-select drives chip-select inputs to front-side DRAM chips while the second rank-select drives chip-select inputs to back-side DRAM chips. Wiring traces on the PCB cross-over data nibbles between the solder pads and the connector to allow two ×4 chips to drive a byte driven by only one ×8 chip.

20 Claims, 7 Drawing Sheets

FIG. 2A  16 CHIPS, 1 RANK

FIG. 2B  16 CHIPS, 2 RANKS

MEMORY-MODULE BOARD LAYOUT FOR USE WITH MEMORY CHIPS OF DIFFERENT DATA WIDTHS

FIELD OF THE INVENTION

This invention relates to memory modules, and more particularly to board layouts of memory modules supporting memory chips of varying data widths.

BACKGROUND OF THE INVENTION

Many types of electronics systems contain memory. A common, low-cost memory is dynamic-random-access memory (DRAM). Rather than sell individual DRAM chips, such chips are often pre-assembled into modules that can be inserted into sockets in a wide variety of systems. Such memory modules have gained enormous popularity in recent years. Most personal computers (PC's) are shipped with sockets for memory modules so the PC user can later add additional modules, increasing the memory capacity of the PC. High-volume production and competition have driven module costs down dramatically, benefiting the PC buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

Figure 1A:
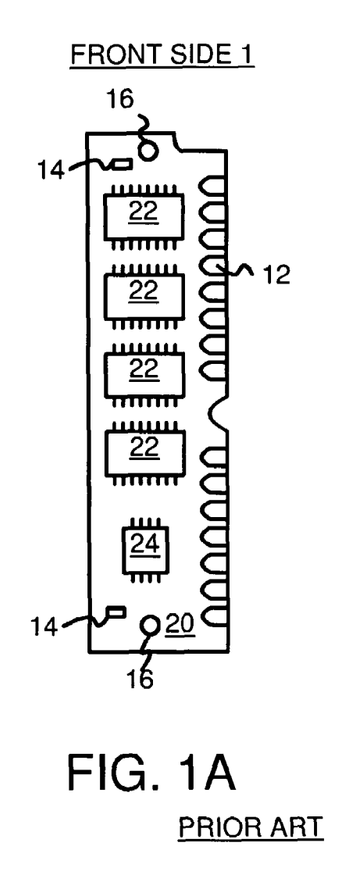
FIGS. 1A-B show a double-sided memory module.
Figure 1B:
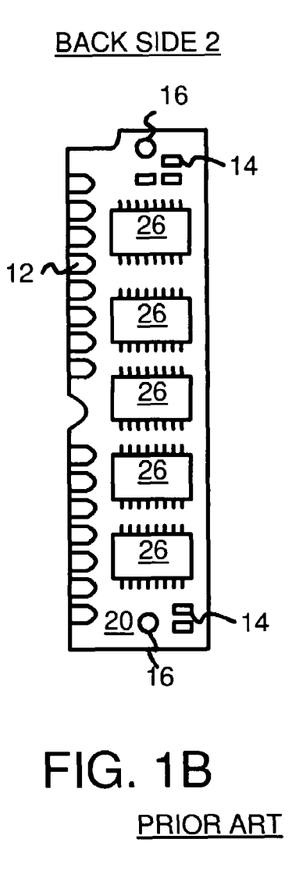

FIGS. 1A-B show a double-sided memory module. Memory module 20 contains a substrate such as a multi-layer printed-circuit board (PCB) with surface-mounted DRAM chips 22 mounted to the front surface or side of the substrate, as shown in FIG. 1A, while more DRAM chips 26 are mounted to the back side or surface of the substrate as shown in FIG. 1B. Metal contact pads 12 are positioned along the bottom edge of the module on both front and back surfaces. Metal contact pads 12 mate with pads on a module socket to electrically connect the module to a PC's motherboard. Holes 16 and notches are present on some kinds of modules to ensure that the module is correctly positioned in the socket. Capacitors 14 or other discrete components are surface-mounted on the substrate to filter noise from DRAM chips 22, 26.

Flash memory 24 is an electrically-erasable programmable read-only memory (EEPROM) that can be programmed by the manufacturer. Configuration information about the memory is often written to flash memory 24. Such configuration information may include the memory depth and width, locations of bad memory cells, speed of the memory, the type of memory, a manufacturing week code, critical timing parameters such as clock rate, CAS (column address select) latency, and any proprietary information. Flash memory 24 is known in one embodiment as a serial-presence detect (SPD) memory. During boot-up, the PC checks for "serial presence" on its memory bus. If a serial presence is detected, the PC reads the stored memory configuration through the serial line. Once programmed, flash memory 24 can be read by a PC on boot-up to determine the kind of memory installed in the PC.

A manufacturer may produce several different kinds of memory modules for sale. For example, one kind of memory module may contain ×4 DRAM chips that are 4 data bits wide, while a second kind of memory module may contain ×8 DRAM chips that are 8 bits wide. Some customers may order memory modules with the ×8 DRAM chips, while other customers order memory modules with ×4 DRAM chips. Predicting the exact product mix of ×4 and ×8 chip modules can be difficult, and incorrectly predicting the product mix may lead to increased inventory cost or delayed or lost sales.

What is desired is a memory module substrate board that can support either ×4 or ×8 DRAM chips. A memory module board that can have DRAM chips of varying data widths mounted thereon is desirable. A single memory module PCB that can be used to manufacture several kinds of memory modules is desirable.

DETAILED DESCRIPTION

The present invention relates to an improvement in memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have discovered that a universal memory module printed-circuit board (PCB) layout may be used for different types of memory modules. In particular, a multi-type layout for a PCB can be used for building memory modules that use either ×4 or ×8 DRAM chips. A single footprint on the PCB layout can have either a ×4 or a ×8 DRAM chip mounted to it. When ×4 DRAM chips are mounted on the multi-type footprints, one type of memory module is constructed, while when ×8 DRAM chips are mounted on the multi-type footprints, a second type of memory module is constructed. Thus two or more types of memory modules can be constructed from the same module PCB. Using a multi-type memory module board can allow for reduced inventory costs as the same PCB can be used to construct two or more types of memory modules.

Various sizes (data depths and widths) of memory modules can be produced using different types of DRAM chips. The number of DRAM chips in a module depends on the capacity and data-width of the DRAM chips and the size of the memory module. For example, a memory module constructed from 64 Mega-bit×4-bit-output (64M×4) DRAM chips needs 16 of these 4-bit-wide DRAM chips to fill a 64-bit bus. The module has a capacity of 512 Megabytes (MB). When ×8 DRAM chips are used, only eight ×8 DRAM chips are needed for the 64-bit bus.

The DRAM chips in a memory module can be arranged into more than one bank or rank. For example, using ×4 DRAM chips, a two-rank memory module with a total capacity of 1024 MB can have two ranks of 16 DRAM chips per rank, using 64M×4 chips.

Figure 2A:
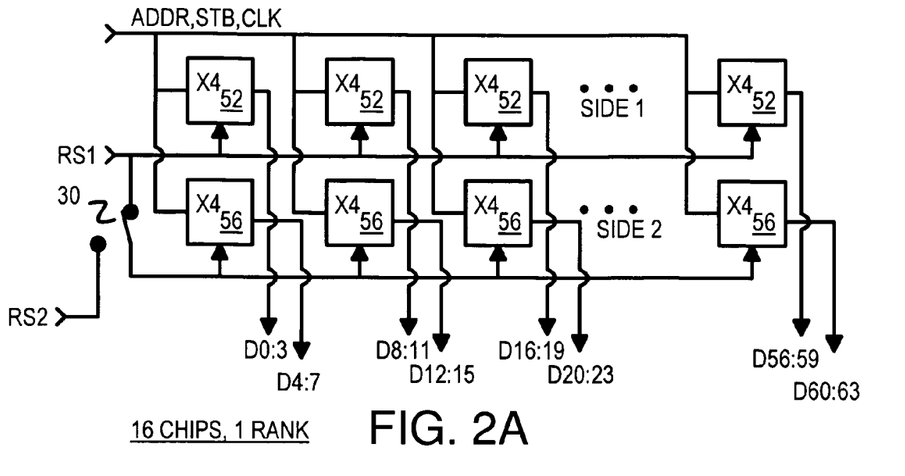
FIG. 2A is a schematic of a memory module with one rank of ×4 DRAM chips.

FIG. 2A is a schematic of a memory module with one rank of ×4 DRAM chips. DRAM chips 52 on side 1, and DRAM chips 56 on side 2 form a single rank. To drive 64 external data bits, a total of 16 DRAM chips 52, 56 are needed on the two sides of the module substrate. When 128M×4 DRAM chips are used, the module contains 1024 MB.

Most signals are shared by all DRAM chips on both sides. For example, control signals such as address strobes, write-enable, clocks, etc. and address lines are connected to all DRAM chips on both sides on the memory module. Data lines are each shared by one chip on the module. Data lines D0-D3 are driven by a first DRAM chip 52 on the first side, while data lines D4-D7 are driven by a first DRAM chip 56 on the second side. Likewise, data lines D8-D11 are driven by a second DRAM chip 52 on the first side, while data lines D12-D15 are driven by a second DRAM chip 56 on the second side.

Since there is only one rank on the memory module, only one rank select is needed for the memory module. Rank select RS1 is connected to chip-select inputs for all DRAM chips 52, 56 on both sides of the memory module. When the chip select (RS1) is not activated, the control signals are ignored by the DRAM chips. The data lines are not driven by the non-selected rank of DRAM chips to prevent data conflicts.

Switch 30 is set to connect the first rank-select input to the memory module, RS1, to the chip-select inputs to DRAM chips 56 on the second side. The second rank-select input to the module, RS2, is disconnected by switch 30. Switch 30 could be a switch or could be a jumper that is set during manufacture.

Figure 2B:
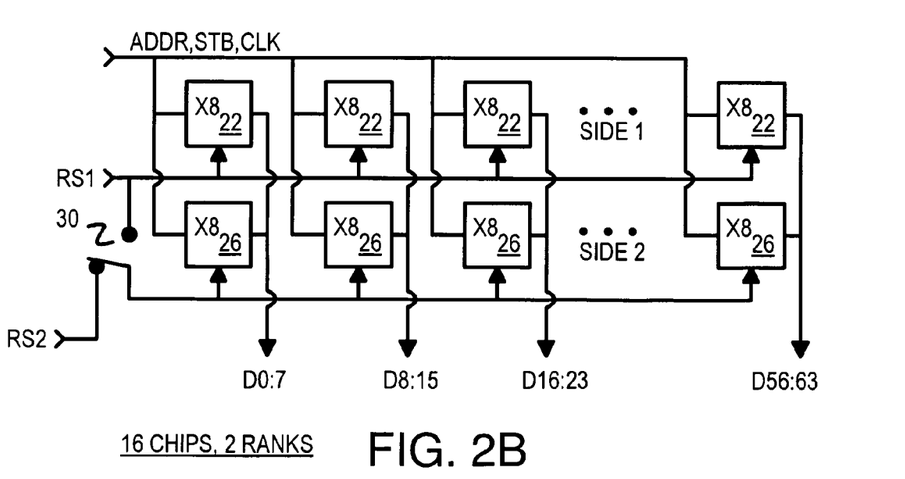
FIG. 2B is a schematic of a memory module with two ranks of ×8 DRAM chips.

FIG. 2B is a schematic of a memory module with two ranks of ×8 DRAM chips. DRAM chips 22 form a first rank on side 1, while DRAM chips 26 form a second rank on side 2. A total of 8 DRAM chips 22 are in the first rank, while another 8 DRAM chips 26 form the second rank. When 64M×8 DRAM chips are used, each rank contains 512 MB.

Most signals are shared by all DRAM chips in both ranks. For example, control signals such as address strobes, write-enable, clocks, etc. and address lines are connected to all DRAM chips in both ranks on the memory module. Data lines are each shared by one chip in each of the ranks. Data lines D0-D7 are shared by a first DRAM chip 22 in the first rank and by a first DRAM chip 26 in the second rank. Likewise, data lines D8-D15 are shared by a second one of DRAM chips 22, 26.

The ranks are selected by chip-select or rank-select signals. Only one rank select is activated at a time for the memory module. Rank select RS1 activates DRAM chips 22 in the first rank, while rank select RS2 selects DRAM chips 26 in the second rank. When the rank's chip select is not activated, the control signals are ignored by DRAM chips in the rank. The data lines are not driven by the non-selected rank of DRAM chips to prevent data conflicts.

The first rank-select input to the memory module, RS1, is connected to the chip-select inputs to DRAM chips 22 in the first rank. Switch 30 is set to connect the second rank-select input to the memory module, RS2, to the chip-select inputs to DRAM chips 26 in the second rank. Switch 30 could be a switch or could be a jumper that is set during manufacture.

While the memory module has 16 DRAM chips in both FIGS. 2A, 2B, the module uses ×4 chips in a single rank in FIG. 2A, but uses ×8 chips organized into two ranks in FIG. 2B. Using switch 30 to connect or disconnect the second rank-select input RS2, both configurations may be supported. When the PCB containing the DRAM chips has a layout with multi-type footprints, modules with both the configurations of FIG. 2A and FIG. 2B can be constructed from the same PCB.

Figure 3:
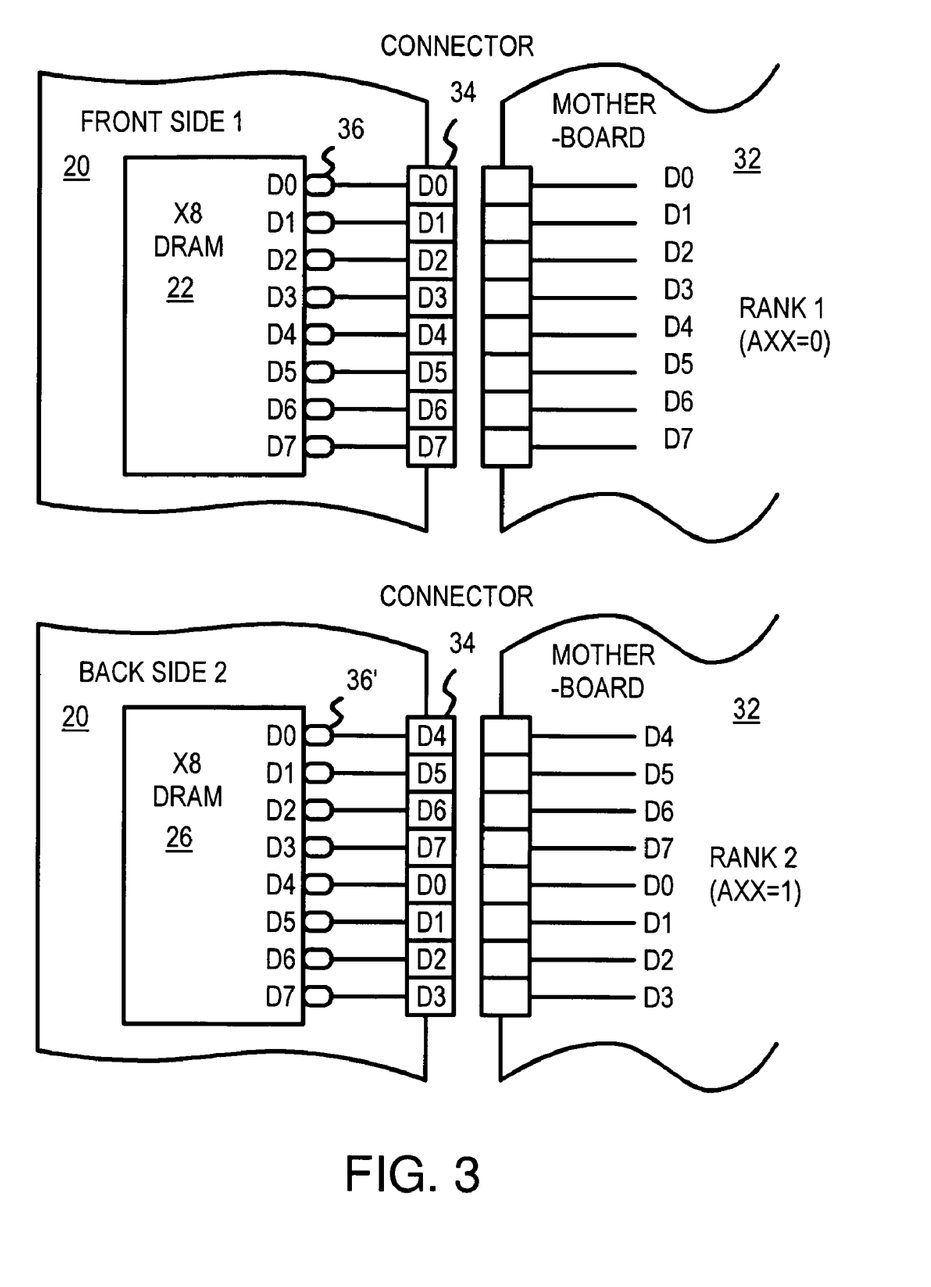
FIG. 3 shows ×8 DRAM chips mounted to front and back sides of a multi-type memory module.

FIG. 3 shows ×8 DRAM chips mounted to front and back sides of a multi-type memory module. Memory module 20 is formed from a PCB substrate that has multi-type footprints on the front side that DRAM chips 22 are mounted to, and other multi-type footprints on the back side that DRAM chips 26 are mounted to.

DRAM chips 22, 26 are ×8 chips and have 8 data I/O pins D0-D7. During assembly, solder paste is applied over the surface of the PCB, and pins, leads, solder balls, or other solder-connectors of DRAM chips 22, 26 are aligned to solder pads 36, 36' on the PCB. Heat is applied to reflow the solder paste, forming a solder connection from the pins of DRAM chips 22, 26 to solder pads 36, 36'. Other solder pads 36, 36' (not shown) are present for other signals and for power and ground to DRAM chips 22, 26.

Wiring traces on the PCB connect solder pads 36, 36' to pads on connector 34. Connector 34 has pads that align to and electrically connect to pads in a socket on motherboard 32. These traces may have various shapes and may bend around and cross over other traces using vias to other layers. However, the location of signals on connector 34 is typically pre-defined by a memory-module standard, and traces must be routed from solder pads 36, 36' to these pre-defined pad locations in connector 34. For ease of illustration, these traces are shown as straight lines in the Figures, but are usually much more complex.

Since DRAM chips 22, 26 are ×8 DRAMs, each has 8 data I/O pins D0-D7 which are connected to one of the 8 bytes of the 64-bit data bus in connector 34. Just the first of DRAM chips 22, 26 to the first data byte are shown.

For DRAM chip 22 on the front side, the data I/O D0-D7 from solder pads 36 can connect to data lines D0-D7 on connector 34 and to motherboard 32. Front-side DRAM chips 22 are in rank 1. Back-side DRAM chips 26 are in rank 2. Both ranks use the same data and address lines on connector 34, but an extra address bit AXX is used by the memory controller on motherboard 32 to select the first or second rank. This address bit AXX is not applied to DRAM chips 22, 26.

Figure 4:
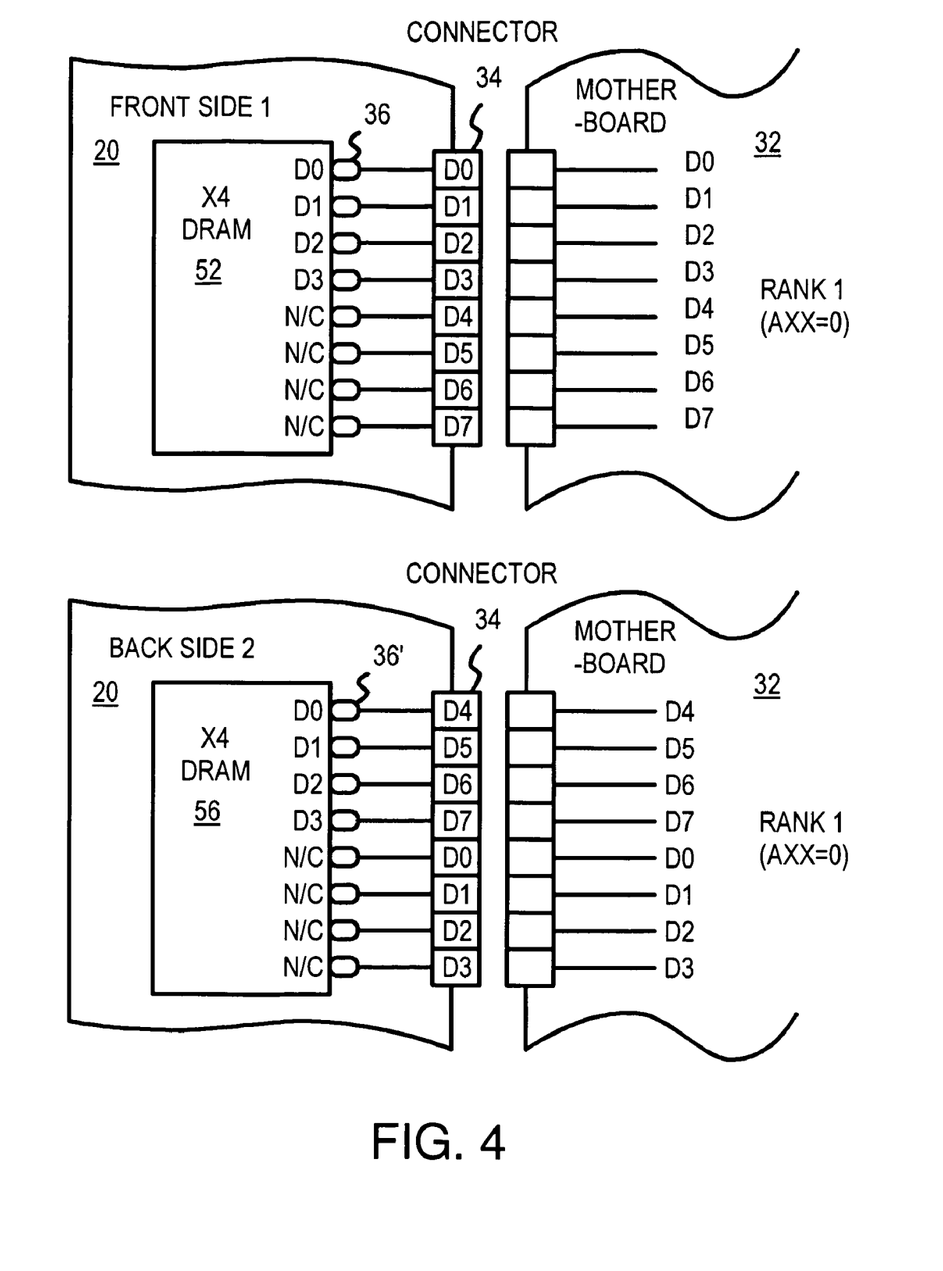
FIG. 4 shows ×4 DRAM chips mounted to front and back sides of a multi-type memory module.

For DRAM chip 26 on the back side, the data I/O D0-D7 from solder pads 36' also can connect to data lines D0-D7 on connector 34 and to motherboard 32. However the upper and lower nibbles are crossed-over. D0-D3 from DRAM chip 26 and solder pads 36' connect to D4-D7 of connector 34. Likewise, D4-D7 from DRAM chip 26 and solder pads 36' connect to D0-D3 of connector 34. This crossing over of the nibbles supports use of ×4 chips (FIG. 4). Similar nibble cross-overs occur for other DRAM chips 26 on the back side, while front-side DRAM chips 22 do not have their data nibbles crossed over.

FIG. 4 shows ×4 DRAM chips mounted to front and back sides of a multi-type memory module. DRAM chips 52, 56 are ×4 chips and have 4 data I/O pins D0-D3. DRAM chips 52, 56 are mounted to the same multi-type footprints on the layout of the PCB substrate of memory module 20 that the ×8 DRAM chips were mounted to in FIG. 3.

DRAM chips 52, 56 have the same dimensions and number of pins as the ×8 DRAM chips. Thus ×4 DRAM chips can be mounted to the same multi-type footprints as the ×8 DRAMs. The four additional data I/O D4-D7 on ×8 DRAMs correspond to no-connect (N/C) pins in ×4 DRAMS. The no-connect pins have a physical pin or package lead, but the lead does not connect to internal circuitry on the DRAM die inside the package. The N/C pins are thus electrical opens but are still soldered to solder pads 36, 36'.

Since DRAM chips 52, 56 are ×4 DRAMs, each has 4 data I/O pins D0-D3, which are connected to one of the 16 half-bytes (nibbles) of the 64-bit data bus in connector 34. Just the first of DRAM chips 52, 56 to the first data byte are shown. All 16 DRAM chips 52, 56 are in the same (first) rank.

For DRAM chip 52 on the front side, the data I/O pins D0-D3 soldered to solder pads 36 connect to data lines D0-D3 on connector 34 and to motherboard 32. The four N/C pins from DRAM chip 52 are soldered to solder pads 36 that connect to data lines D4-D7 on connector 34.

For DRAM chip 56 on the back side, the data I/O pins D0-D3 are soldered to solder pads 36' that connect to data lines D4-D7 on connector 34 and to motherboard 32. The upper and lower nibbles are crossed-over. D0-D3 from DRAM chip 56 and solder pads 36' connect to D4-D7 of connector 34. Likewise, the four no-connect pins from DRAM chip 56 and solder pads 36' D4-D7 connect to D0-D3 of connector 34.

This crossing over of the nibbles supports use of ×4 chips. Front-side DRAM chip 52 drives the lower nibble (D0-D3), while back-side DRAM chip 56 drives the upper nibble (D4-D7). Other pairs of front and back-side DRAM chips also drive upper and lower nibbles of other data bytes in the 64-bit data output on connector 34.

The four N/C pins from DRAM chip 52 are soldered to solder pads 36 that connect to data lines D4-D7 on connector 34. The four N/C pins from back-side DRAM chip 56 are soldered to solder pads 36' that connect to data lines D0-D3 on connector 34. Thus connector pads D0-D3 are connected by wiring traces on memory module 20 to solder pads 36 for pins D0-D3 of front-side DRAM chip 52, and to solder pads 36' for the 4 N/C pins of back-side DRAM chip 56. Since the N/C pins on DRAM chip 56 are opens, only one DRAM chip 52 drives these four pins, although both DRAM chips 52, 56 are soldered to these four data lines.

Likewise, connector pads D4-D7 are connected by wiring traces on memory module 20 to solder pads 36' for pins D0-D3 of back-side DRAM chip 56, and to solder pads 36 for the 4 N/C pins of front-side DRAM chip 52. Since the N/C pins on DRAM chip 52 are opens, only one DRAM chip 56 drives these four pins, although both DRAM chips 52, 56 are soldered to these four data lines.

Figure 5:
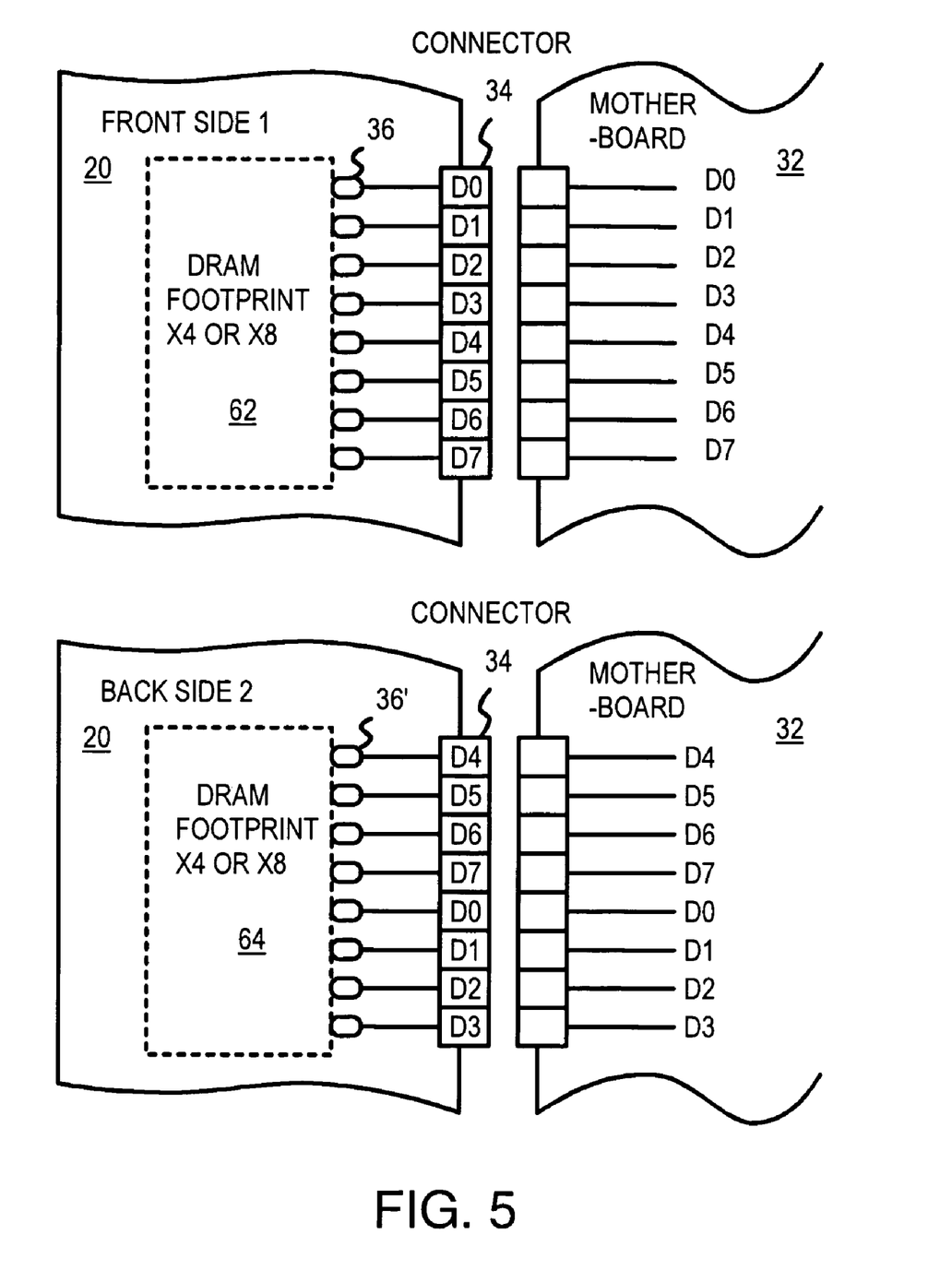
FIG. 5 shows multi-type footprints that can have either ×4 or ×8 DRAM chips mounted thereon for the multi-type memory module.

While data-line pads D0-D7 on connector 34 are shown in FIGS. 3-5 on both front and back sides to show connection by wiring traces to solder pads 36, 36', each data line has only one connector pad in connector 34, which is on either the front or back side, not both sides as shown. The order and exact location within connector 34 of the data lines depends on the memory module specification and is not as shown in the simplified drawings. Other signals such as module rank-selects and strobes also appear on only one of the sides of connector 34, unless two connector pads are used.

FIG. 5 shows multi-type footprints that can have either ×4 or ×8 DRAM chips mounted thereon for the multi-type memory module. The front side of the PCB for memory module 20 has eight multi-type footprints 62, while the back side of the PCB has eight more multi-type footprints 64. Multi-type footprints 62 are surrounded by solder pads 36 in an arrangement corresponding to lead locations on a DRAM chip. The DRAM chip soldered to solder pads 36 can be either ×8 DRAM chip 22 or ×4 DRAM chip 52.

On the back side, multi-type footprints 64 are surrounded by solder pads 36' in an arrangement or layout corresponding to lead locations on a DRAM chip. The DRAM chip soldered to solder pads 36' can be either ×8 DRAM chip 26 or ×4 DRAM chip 56.

The four data I/O pins from multi-type footprint 62 are connected by wiring traces to data lines D0-D3 of connector 34. The four N/C pins are connected by traces to data lines D4-D7 of connector 34. For back-side multi-type footprint 64, the four data I/O pins D0-D3 are crossed-over and connected by wiring traces to data lines D4-D7 of connector 34. The four N/C pins are crossed-over and connected by traces to data lines D0-D3 of connector 34. Other multi-type footprints 62, 64 connect to other bytes in data lines D0-D63 in a similar fashion.

Figure 6:
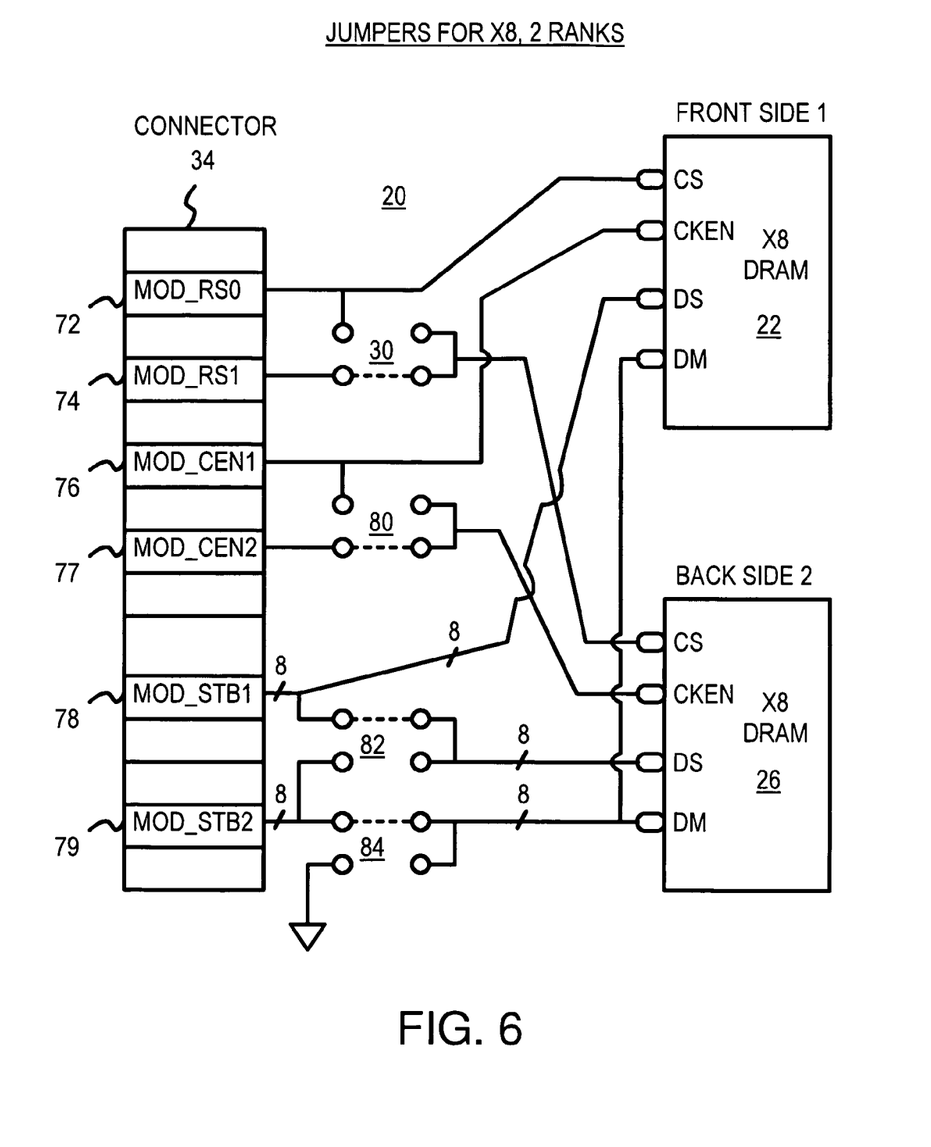
FIG. 6 shows switch or jumpers set for a multi-type memory module populated with ×8 DRAM chips.

FIG. 6 shows switch or jumpers set for a multi-type memory module populated with ×8 DRAM chips. Connector 34 also has connector pads for control signals, such as module rank-select 0 (MOD_RS0) and module rank-select 1 (MOD_RS1), which select the first or second ranks when the memory module contains two ranks.

When memory module 20 is populated with ×8 DRAM chips 22, 26, RS0 connector pad 72 is routed by wiring traces on memory module 20 to the chip-select (CS) inputs of front-side DRAM chips 22. RS1 connector pad 74 is routed through switch 30 and wiring traces on memory module 20 to the chip-select (CS) inputs of back-side DRAM chips 26. Thus first-rank front-side DRAM chips 22 are activated when RS0 is activated, while second-rank back-side DRAM chips 26 are activated when RS1 is activated.

Other control signals in connector 34 include module clock-enable inputs MOD_CEN1 and MOD_CEN2. CEN1 connector pad 76 is routed by wiring traces on memory module 20 to the clock-enable (CKEN) inputs of front-side DRAM chips 22. CEN2 connector pad 77 is routed through switch 80 and wiring traces on memory module 20 to the clock-enable (CKEN) inputs of back-side DRAM chips 26. Thus first-rank front-side DRAM chips 22 have clocks enabled when CEN1 is activated, while second-rank back-side DRAM chips 26 have their clocks enabled when CEN2 is activated. When clocks are not enabled, DRAM chips 22, 26 are in a stand-by mode and draw reduced power. Clocks typically are enabled before chips can be selected for access by chip-select signals.

Still other control signals in connector 34 include module strobe inputs MOD_STB1 and MOD_STB2. There are 8 MOD_STB1 inputs in connector 34 and 8 MOD_STB2 inputs in connector 34. First strobe connector pads 78 are separately routed by wiring traces on memory module 20 to the data strobe (DS) inputs of the 8 front-side DRAM chips 22 and through switch 82 to the data strobe (DS) inputs of back-side DRAM chips 26. Switches 82, 84 are each 8 bits wide. Data strobes are activated to enable data to be driven or read from the data lines.

The 8 second strobe connector pads 79 are routed by wiring traces on memory module 20 and by 8-bit-wide switch 84 to the 8 data mask (DM) inputs of the 8 front-side DRAM chips 22 and to the 8 data mask (DM) inputs of 8 back-side DRAM chips 26. Each second strobe connector pad 79 is routed to a pair of one front-side DRAM chip 22 and one back-side DRAM chip 26. Data mask is activated to mask portions of the data being read or written, such as masking one of the 8 bytes of the 64-bit data on the data lines on connector 34.

The memory controller on the motherboard determines the functionality of memory module 20 during an initialization routine. A SPD EEPROM on memory module 20 is read by an initialization routine for the memory controller. The details of the module type in the SPD EEPROM indicate the functions of the module strobes. For example, the module type may indicate that two ranks of ×8 DRAM chips are used, so the two rank selects need to be generated. Also, the SPD configuration information may indicate that all chips have both a data strobe and a data mask input. The initialization routine can enable the memory controller to generate these data strobe and data mask signals during memory accesses to this memory module.

Switches 30, 80, 82, 84 can be switches such as dual-inline-package (DIP) switches, or can be jumpers such as discrete wires or solder bridges that bridge over a gap between two solder pads that form the switch. The jumper can be made from metal and be zero-ohms or have a very low resistance.

Figure 7:
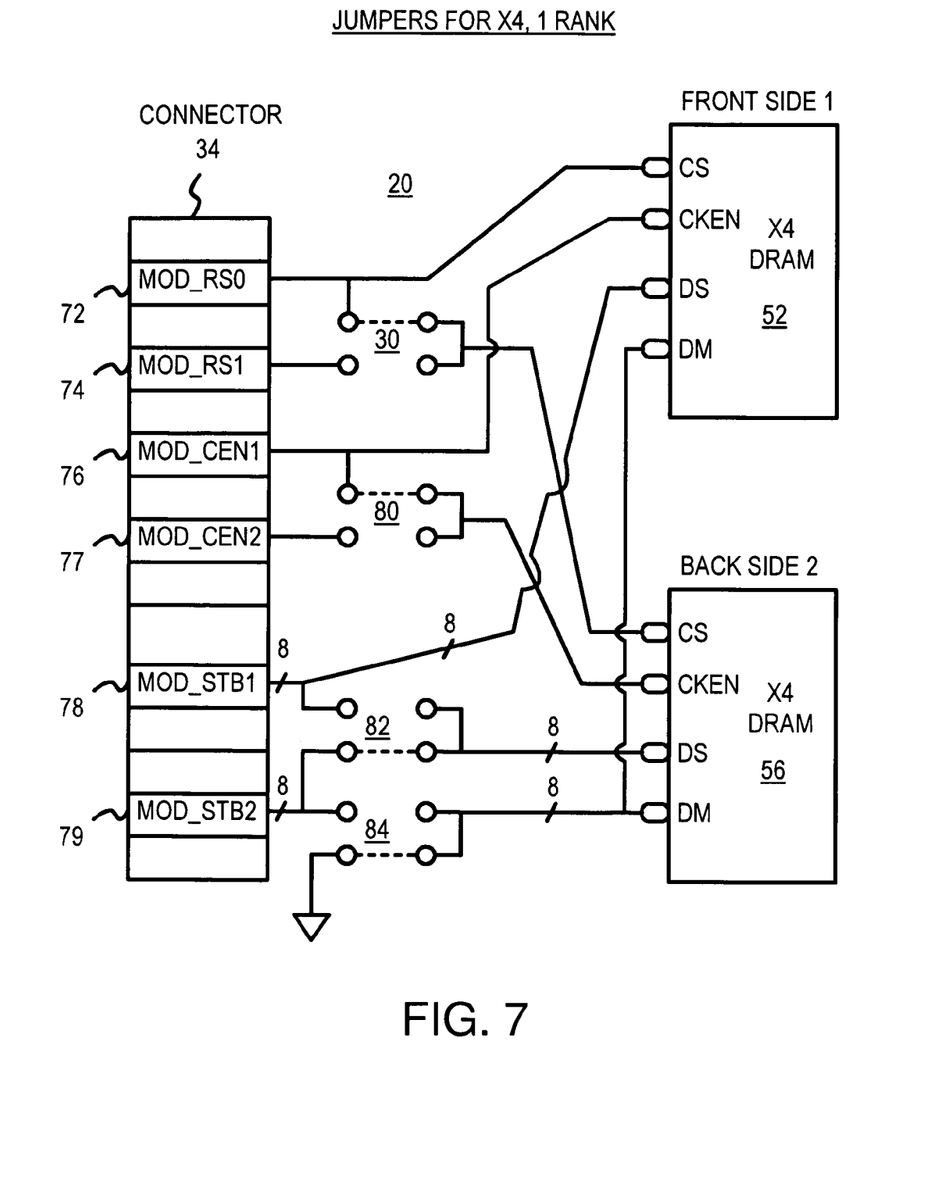
FIG. 7 shows switch or jumpers set for a multi-type memory module populated with ×4 DRAM chips.

FIG. 7 shows switch or jumpers set for a multi-type memory module populated with ×4 DRAM chips. When memory module 20 is populated with ×4 DRAM chips 52, 56, RS0 connector pad 72 is routed by wiring traces on memory module 20 to the chip-select (CS) inputs of front-side DRAM chips 52. RS0 connector pad 72 is also routed through switch 30 and wiring traces on memory module 20 to the chip-select (CS) inputs of back-side DRAM chips 56. Thus chip-select inputs for all DRAM chips 52, 56 are driven by the first rank select input, RS0. RS1 connector pad 74 is not used and is disconnected by switch 30.

Since there is only one rank, only one clock-enable input is used for memory module 20. CEN1 connector pad 76 is routed by wiring traces on memory module 20 to the clock-enable (CKEN) inputs of front-side DRAM chips 52 and through switch 80 to the clock-enable (CKEN) inputs of back-side DRAM chips 56. Thus both front-side DRAM chips 52 and back-side DRAM chips 56 have their clocks enabled when CEN1 is activated. When clocks are not enabled, DRAM chips 52, 56 are in a stand-by mode and draw reduced power. Clocks typically are enabled before chips can be selected for access by chip-select signals. CEN2 connector pad 77 is disconnected by switch 80 and is not used.

Separate data strobes are used for DRAM chips on front and back sides. Since the front-side and backside DRAM chips 52, 56 are selected at the same time, the data strobes cannot be tied together as for the ×8 case. The 8 MOD_STB1 lines are used as the data strobes for front-side DRAM chips 52 while the 8 MOD_STB2 lines are used as the data strobe for backside DRAM chips 56. Data strobe can be bi-directional, being generated by a memory controller on the motherboard for writes and being generated by the DRAM chips for reads.

The 8 first strobe connector pads 78 are routed by separate wiring traces on memory module 20 to the data strobe (DS) inputs of the 8 front-side DRAM chips 52. However, switch 82 disconnects MOD-STB1 lines from the data strobe (DS) inputs of back-side DRAM chips 56. The MOD-STB1 lines are activated to enable data to be driven to or read from the data lines D0-D3, D8-D11, D16-D19, D24-D27, D32-D35, D40-D43, D48-D51, and D56-D59 that connect to front-side DRAM chips 22.

The 8 second strobe connector pads 79 (MOD_STB2) are separately routed through 8-bit switch 82 and by wiring traces on memory module 20 the data strobe (DS) inputs of back-side DRAM chips 56. However, switch 82 disconnects MOD-STB2 from the data strobe (DS) inputs of front-side DRAM chips 52. Data strobe 2 is activated to enable data to be driven to or read from one or more of the data lines D4-D7, D12-D15, D20-D23, D28-D31, D36-D39, D44-D47, D52-D55, and D60-D63 that connect to back-side DRAM chips 56.

The data mask inputs (DM) are not used. Instead, switch 84 grounds the data mask (DM) inputs of front-side DRAM chips 52 and the data mask (DM) inputs of back-side DRAM chips 56. Grounding the data-mask inputs disables this feature so that all data bytes are written.

ALTERNATE EMBODIMENTS

Several other embodiments are contemplated by the inventors. For example two, three, or more DRAM chips could be stacked together and mounted onto a single DRAM footprint on the PCB. The chip-select pins for chips in the stack could be bent out to be separately driven. Additional chip-selects or module-selects could be used, and the memory module could have 3 or more ranks. Rather than select ranks using chip-select, other signals could be used such as an address or a data strobe signal. Some memories may have more than one chip select input, and some combination of these chip selects could be used to select the DRAM chips.

The ×4 and ×8 DRAM chips could differ slightly in dimensions and number of pins. For example, the ×8 DRAMs could have pins that are missing from the ×4 DRAMs, but since most of the pin layout is the same, the ×4 and ×8 DRAMs can mount to the same multi-type footprints. The missing pin locations of ×4 chips simply do not solder to underlying solder pads 36, 36'.

Rather than use ×4 and ×8 DRAM chips, other chip sizes could be substituted, such as ×8 and ×16 DRAM chips, or ×4 and ×16 DRAM chips, or other data widths.

The number of DRAM chips, capacitors, buffers, and other components on each side of the substrate can be varied. Wide or narrow DRAM chips of one, two, or eight or more bits may be substituted. Other kinds of Integrated Circuits (IC's) can be mounted on the PCB substrate, such as an address or bank decoder or a parity generator or error detector.

DRAM chips can also be used for storing ECC (error correction and control) bits. A conventional memory module that supports ECC function uses 8 ECC bits in addition to the 64 data bits, for a total of 72 bits.

Future memory modules may use memory chips other than DRAMs, or improved DRAMs such as fully-buffered, synchronous, or super-pipelined DRAMs. Some bursting DRAMs re-name the CAS signal as the chip-enable signal (CE), since they do not need a column address for all accesses. The chip-enable signal may be considered as a type of CAS signal for some memories.

The terms "front side" and "back side" are arbitrarily assigned as shown in the Figures and each term could refer to either surface of the module in relation to the notch. Vias of through-holes provide electrical connection between the surfaces or intermediate layers. These through-holes could be filled in holes or metal traces between layers rather than open holes, and can also be formed during the PCB processing as an integral part of the PCB.

The electrical assignment of functions or signals to pins or leads, the metal contact pads in connector 34 along the bottom of the module, is usually determined by an industry standard-setting committee, such as JEDEC. JEDEC specifies the order of the pins and the size of the module to allow for interchangeability of modules with sockets. Redundant power and ground pins are usually assigned symmetric positions to avoid reversing the power and ground supplies if the module is inserted backwards. The locations of data I/O can be in non-numerical order (D0, D5, D23, D18, D4, . . . ) and can have other signals such as ground inserted between data pads.

DRAM chips are usually connected to a data pin as close to the chip as possible to minimize wiring lengths and delay. Multi-layer printed circuit board (PCB) substrates can share the power and ground planes with signal traces to reduce the number of layers used from 8 layers to 6 layers. Many other configurations are possible. Modules with multiple rows of leads, such as dual-inline-memory modules (DIMMs) can also benefit from the invention.

The terms "pins" and "leads" are used interchangeably and are meant to refer to any kind of connector that makes an electrical connection between inputs and outputs to a memory chip and solder pads 36, and may include an array of solder balls, metal pads, metal bumps, metal leads bent inward, outward, under, or in a wide variety of other ways, surface-mounting pads formed on the bottom of the chip package, and other lead technologies. True "pins" that poke through holes in the PCB are rarely used today, having been replaced by surface-mount technologies that do not require through-holes in the PCB, yet the term pins is still used.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multi-type memory module substrate board comprising:
    a substrate board, the substrate board being a multi-layer printed-circuit board (PCB) substrate;
    an edge connector having connector pads for mating with metal connectors in a memory module socket on a motherboard, the connector pads including data pads;
    a plurality of chip pairings on the substrate board that each drive different data groups of data pads in the edge connector, each chip pairing comprising:
    a first multi-type footprint on a front side of the substrate board, the first multi-type footprint having a size to accept a first memory chip;
    wherein the first memory chip has a first data width when a first type of memory module is being assembled from the multi-type memory module substrate board, and has a second data width when a second type of memory module is being assembled from the multi-type memory module substrate board;
    wherein the second data width is larger than the first data width;
    first solder pads surrounding the first multi-type footprint, the first solder pads for forming solder connections to metal leads of the first memory chip during assembly;
    first wiring traces formed on or within the substrate board, the first wiring traces connecting a first data group of the first solder pads to a first data group of the connector pads in the edge connector;
    second wiring traces formed on or within the substrate board, the second wiring traces connecting a second data group of the first solder pads to a second data group of the connector pads in the edge connector;
    a second multi-type footprint on a back side of the substrate board, the second multi-type footprint having a size to accept a second memory chip;
    second solder pads surrounding the second multi-type footprint, the second solder pads for forming solder connections to metal leads of the second memory chip during assembly;
    first cross-over wiring traces formed on or within the substrate board, the first cross-over wiring traces connecting a first data group of the second solder pads to the second data group of the connector pads in the edge connector; and
    second cross-over wiring traces formed on or within the substrate board, the second cross-over wiring traces connecting a second data group of the second solder pads to the first data group of the connector pads in the edge connector;
    wherein when the first and second memory chips each have the first data width, the first memory chip drives data onto the first data group in the edge connector but does not drive data onto the second data group in the edge connector, and the second memory chip drives data onto the second data group in the edge connector but does not drive data onto the first data group of in the edge connector;
    wherein when the first and second memory chips each have the second data width, the first memory chip drives data onto the first data group in the edge connector and drives data onto the second data group of in the edge connector in response to a first chip-select signal, and the second memory chip drives data onto the first data group in the edge connector and drives data onto the second data group of in the edge connector in response to a second chip-select signal;
    wherein the first and second chip-select signals are activated on different access cycles for memory chips having the second data width,
    whereby the multi-type memory module substrate board is assembled into the first type of memory module when the first and second memory chips have the first data width, and into the second type of memory module when the first and second memory chips have the second data width.

2. The multi-type memory module substrate board of claim 1 wherein when the first and second memory chips each have the first data width, the first memory chip has first dummy package leads that form solder connections to the second data group of the first solder pads;
    wherein the first dummy package leads are not driven by data from the first memory chip;
    the second memory chip has second dummy package leads that form solder connections to the second data group of the second solder pads;

wherein the second dummy package leads are not driven by data from the second memory chip, whereby dummy package leads soldered to the second solder pads are crossed-over by the second cross-over wiring traces.

3. The multi-type memory module substrate board of claim 2 wherein when the first and second memory chips each have the second data width, the first memory chip has no dummy package leads that form solder connections to the second data group of the first solder pads;

the second memory chip has no dummy package leads that form solder connections to the second data group of the second solder pads;

whereby dummy package leads to the second data group are present when memory chips have the first data width, but are not present when memory chips have the second data width.

4. The multi-type memory module substrate board of claim 2 wherein the first and second dummy package leads are no-connect leads that are electrically open and do not connect to internal circuitry in a memory chip.

5. The multi-type memory module substrate board of claim 4 wherein the second data width is double the first data width.

6. The multi-type memory module substrate board of claim 5 wherein the first data width is 4 bits and the second data width is 8 bits and wherein the first data group and the second data group are nibbles.

7. The multi-type memory module substrate board of claim 5 wherein the first data width is 8 bits and the second data width is 16 bits and wherein the first data group and the second data group are bytes.

8. The multi-type memory module substrate board of claim 1 further comprising:

a first module rank-select input on the edge connector;

first-rank wiring traces on the substrate board for connecting the first module rank-select input to the first chip-select signal input to the first memory chip; and a chip-select switch mounted on the substrate board, for connecting the first module rank-select input from the edge connector to the second chip-select signal when the first and second memory chips have the first data width, but for disconnecting the first module rank-select input from the second chip-select signal when the first and second memory chips have the second data width.

9. The multi-type memory module substrate board of claim 8 wherein the chip-select switch is further for connecting a second module rank-select input to the second chip-select signal when the first and second memory chips have the second data width, whereby rank-select inputs are re-routed by the chip-select switch when assembling the second type of memory module.

10. The multi-type memory module substrate board of claim 8 further comprising:

a first module strobe input on the edge connector;

first-strobe wiring traces on the substrate board for connecting the first module strobe input to a first data-strobe input to the first memory chip;

a first strobe switch mounted on the substrate board, for connecting the first module strobe input from the edge connector to a second data-strobe input to the second memory chip when the first and second memory chips have the first data width, but for disconnecting the first module strobe input from the second data-strobe input to the second memory chip when the first and second memory chips have the second data width, wherein the chip-select switch is further for connecting a second module strobe input to the second data-strobe input to the second memory chip when the first and second memory chips have the second data width.

11. The multi-type memory module substrate board of claim 10 further comprising:

a mask switch, mounted on the substrate board, for connecting the second module strobe input from the edge connector to a first data-mask input to the first memory chip and to a second data-mask input to the second memory chip when the first and second memory chips have the first data width, but for driving a disabling voltage onto the first data-mask input and onto the second data-mask input when the first and second memory chips have the second data width, whereby data-mask is enabled for the first data width but disabled for the second data width.

12. The multi-type memory module substrate board of claim 11 wherein the chip-select switch, the first strobe switch, and the mask switch comprise jumpers.

13. A memory module comprising:

a circuit board having a size for fitting into a memory module socket on a motherboard;

a plurality of memory chips including a front-side memory chip mounted on a front side of the circuit board and a back-side memory chip mounted to a back side of the circuit board;

the memory chips having a first data width when a first type of memory module is manufactured from the circuit board, and having a second data width when a second type of memory module is manufactured from the circuit board;

wherein the second data width contains more data bits that the first data width;

a connector along a bottom edge of the circuit board, the connector for making electrical connection with data signals on the motherboard, the connector mating with the memory module socket when inserted;

a plurality of paired footprints, each for driving a different data group of the data signals through the connector;

a front-side location, in a paired footprint, having mounted thereon the front-side memory chip;

front-side solder pads in the front-side location, soldered to leads of the front-side memory chip;

a first front-side pad group of the front-side solder pads that are soldered to a first front-side lead group of data-carrying leads to the front-side memory chip;

a second front-side pad group of the front-side solder pads that are soldered to a second front-side lead group, the second front-side lead group being data-carrying leads to the front-side memory chip when the memory chips are of the second data width;

wherein the second front-side lead group comprises dummy leads that do not carry data to the front-side memory chip when the memory chips are of the first data width;

a front-side chip-select input to the front-side memory chip, the front-side chip-select input selecting the front-side memory chip for data access;

a back-side location, in the paired footprint, having mounted thereon the back-side memory chip;

back-side solder pads in the back-side location, soldered to leads of the back-side memory chip;

a first back-side pad group of the back-side solder pads that are soldered to a first back-side lead group of data-carrying leads to the back-side memory chip;

a second back-side pad group of the back-side solder pads that are soldered to a second back-side lead group, the second back-side lead group being data-carrying leads to the back-side memory chip when the memory chips are of the second data width;

wherein the second back-side lead group comprises dummy leads that do not carry data to the back-side memory chip when the memory chips are of the first data width;

a back-side chip-select input to the back-side memory chip, the back-side chip-select input selecting the back-side memory chip for data access;

first wiring traces on the circuit board that connect the first front-side pad group to a first set of data signals in a data group for the paired footprint and connect the first back-side pad group to a second set of data signals in the data group for the paired footprint, the first set and the second set being non-overlapping sets of data signals;

second direct wiring traces on the circuit board that connect the second front-side pad group to the second set of data signals in the data group for the paired footprint; and second cross-over wiring traces on the circuit board that connect the second back-side pad group to the first set of data signals in the data group for the paired footprint, whereby the circuit board supports manufacture using memory chips of the first data width and of the second data width.

14. The memory module of claim 13 wherein the memory chips are dynamic-random-access memory (DRAM) chips.

15. The memory module of claim 13 further comprising:
a chip-select jumper on the circuit board that connects the back-side chip-select inputs to the front-side chip-select inputs when the memory chips are of the first data width and disconnects the back-side chip-select inputs from the front-side chip-select inputs when the memory chips are of the second data width to allow the back-side chip-select inputs to be driven by a different signal than the front-side chip-select inputs.

16. The memory module of claim 15 wherein the second data width is double the first data width;
wherein the first front-side lead group has an equal number of data leads as the second front-side lead group
wherein the first back-side lead group has an equal number of data leads as the second back-side lead group.

17. The memory module of claim 16 wherein the memory chips of the first data width are ×4 memory chips having four data input-output leads;
wherein the memory chips of the second data width are ×8 memory chips having eight data input-output leads;
wherein the first front-side lead group, the second front-side lead group, the first back-side lead group, and the second back-side lead group each comprises four leads.

18. A multi-type memory module board comprising:
substrate board means for supporting memory chips and wiring traces,
edge connector means for mating with metal connectors in a memory module socket on a motherboard, the edge connector means including data lines;
a plurality of layout pairings on the substrate board means that each drive different data groups of data lines in the edge connector means, each layout pairing comprising:
first multi-type footprint means, on a front side of the substrate board means, for accepting a first memory chip;
wherein the first memory chip has a first data width when a first type of memory module is being assembled from the multi-type memory module board, and has a second data width when a second type of memory module is being assembled from the multi-type memory module board;

wherein the second data width is larger than the first data width;

first solder pad means, surrounding the first multi-type footprint means, for forming solder connections to metal leads of the first memory chip during assembly;

first wiring means, formed on or within the substrate board means, for connecting a first data group of the first solder pad means to a first data group of the data lines in the edge connector means;

second wiring means, formed on or within the substrate board means, for connecting a second data group of the first solder pad means to a second data group of the data lines in the edge connector means;

second multi-type footprint means, on a back side of the substrate board means, for accepting a second memory chip;

second solder pad means, surrounding the second multi-type footprint means, for forming solder connections to metal leads of the second memory chip during assembly;

first cross-over wiring means, formed on or within the substrate board means, the first cross-over wiring traces connecting a first data group of the second solder pad means to the second data group of the edge connector means; and second cross-over wiring means, formed on or within the substrate board means, for connecting a second data group of the second solder pad means to the first data group of the edge connector means;

wherein when the first and second memory chips each have the first data width, the first memory chip drives data onto the first data group in the edge connector means but does not drive data onto the second data group in the edge connector means, and the second memory chip drives data onto the second data group in the edge connector means but does not drive data onto the first data group of in the edge connector means;

wherein when the first and second memory chips each have the second data width, the first memory chip drives data onto the first data group in the edge connector means and drives data onto the second data group of in the edge connector means in response to a first chip-select signal, and the second memory chip drives data onto the first data group in the edge connector means and drives data onto the second data group of in the edge connector means in response to a second chip-select signal;

wherein the first and second chip-select signals are activated on different access cycles for memory chips having the second data width, whereby the multi-type memory module board is assembled into the first type of memory module when the first and second memory chips have the first data width, and into the second type of memory module when the first and second memory chips have the second data width.

19. The multi-type memory module board of claim 18 wherein the first and second memory chips are dynamic-random-access memory (DRAM) chips of a same type and data width.

20. The multi-type memory module board of claim 18 wherein the first and second memory chips have a same number of external leads.

* * * * *